United States Patent
Cohen et al.

(10) Patent No.: US 10,461,804 B2
(45) Date of Patent: Oct. 29, 2019

(54) ELIMINATION OF CROSSTALK EFFECTS IN NON-VOLATILE STORAGE

(71) Applicant: Western Digital Technologies, Inc., San Jose, CA (US)

(72) Inventors: Moshe Cohen, Modi'in (IL); Refael Ben-Rubi, Rosh Haayin (IL)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 70 days.

(21) Appl. No.: 15/879,680

(22) Filed: Jan. 25, 2018

(65) Prior Publication Data
US 2019/0229766 A1 Jul. 25, 2019

(51) Int. Cl.
| | |
|---|---|
| H04B 3/32 | (2006.01) |
| G11C 16/26 | (2006.01) |
| H04L 7/04 | (2006.01) |
| G06F 13/40 | (2006.01) |
| H04L 25/08 | (2006.01) |

(52) U.S. Cl.
CPC ............ *H04B 3/32* (2013.01); *G06F 13/4072* (2013.01); *G11C 16/26* (2013.01); *H04L 7/04* (2013.01); *H04L 25/085* (2013.01)

(58) Field of Classification Search
USPC .............. 370/201, 216, 219, 220, 221, 227
See application file for complete search history.

(56) References Cited

U.S. PATENT DOCUMENTS

| | | | |
|---|---|---|---|
| 7,443,757 B2 | 10/2008 | Cernea et al. | |
| 8,103,898 B2 | 1/2012 | Dimitriu et al. | |
| 8,935,559 B2 | 1/2015 | Poulton et al. | |
| 9,053,066 B2 | 6/2015 | Ramachandra et al. | |
| 9,069,688 B2 | 6/2015 | Chung et al. | |
| 9,087,025 B2 | 7/2015 | Hollis | |
| 9,170,769 B2 | 10/2015 | Mirchandani et al. | |
| 2008/0089433 A1* | 4/2008 | Cho ..................... | H04B 7/0615 375/267 |

FOREIGN PATENT DOCUMENTS

CN      102915770 A      2/2013

OTHER PUBLICATIONS

Clarke; Memory and Storage; SK Hynix Pushes 16-nm NAND to 128-Gbit; IEEE Acquired Electronics 360; dated Nov. 20, 2013; 2 total pages.

* cited by examiner

*Primary Examiner* — Brenda H Pham
(74) *Attorney, Agent, or Firm* — Patterson & Sheridan, LLP; Steven H. Versteeg

(57) ABSTRACT

A method for elimination of crosstalk effects in a non-volatile storage is disclosed, having steps of identifying at least one line connected to the non-volatile storage that causes crosstalk effects to another line connected to the non-volatile storage, sending a command to the non-volatile storage to replace the at least one line causing crosstalk effects, selecting at least one line to replace the at least one line causing crosstalk effects with a spare line and replacing the at least one line causing crosstalk effects with the spare line.

8 Claims, 2 Drawing Sheets

ELIMINATION OF CROSSTALK EFFECTS IN NON-VOLATILE STORAGE

FIELD OF THE DISCLOSURE

Aspects of the disclosure relate to elimination of crosstalk effects in electrical devices. More specifically, aspects of the disclosure relate to elimination of crosstalk effects in non-volatile storage in memory arrangements, such as in solid state drives.

BACKGROUND INFORMATION

Field

Crosstalk is a phenomenon wherein a signal transmitted on one circuit or channel creates an undesired effect in another circuit or channel. Crosstalk may be caused by undesired capacitive, inductive or conductive coupling from one circuit to another. As a non-limiting example, crosstalk can happen in unshielded wires wherein the wires run in a parallel direction.

In the close confines of today's electrical circuits, there are many opportunities for undesired crosstalk to occur. In memory arrangements/storage crosstalk can also occur. As an example, non-volatile storage crosstalk can occur and cause problems such as when there is crosstalk before encoding and unwanted data, with bit flips, may be written to flash. Subsequently, when the data is read, the data will be different from the data user intended to receive and no error of this different data is provided to the user. In a second problem area, when the interference happens after encoding, unwanted data, with bit flips, will be written to flash. When the data is read back, in some cases, low density parity check (LDPC) will correct the data, but in other instances, LDPC will not be able to fix the data and an uncorrectable error may occur. In a third problem area, after activing all error correcting capabilities, (Full power LDPC, soft bit 2, XOR, etc.) there is a chance that there will be crosstalk to what is transferred out to a user.

In 3D non-volatile flash units, for example, crosstalk effects may be worse than of that in two dimensional non-volatile flash units. Many signals in three dimensional space, for example, may affect each other and/or even accumulate and create increased disturbances.

As the flash circuitry and systems become smaller, the effects of crosstalk can be greatly increased.

There is a need to limit the potential for crosstalk in electrical circuits.

There is also a need to limit the potential for crosstalk in storage systems for computers.

There is also a need to check electrical systems for crosstalk in storage systems for computers and take preventative measures if crosstalk is encountered.

SUMMARY

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

In one non-limiting embodiment, a method for elimination of crosstalk effects in a non-volatile storage is disclosed comprising identifying at least one line connected to the non-volatile storage that causes crosstalk effects to another line connected to the non-volatile storage, sending a command to the flash to replace the at least one line causing crosstalk effects, selecting at least one line to replace the at least one line causing crosstalk effects with a spare line and replacing the at least one line causing crosstalk effects with the spare line. In other example embodiments, the line may also be connected between two (2) sub modules of the storage device, such as a controller and flash.

In another non-limiting embodiment, an arrangement is disclosed comprising means for identifying at least one line connected to the non-volatile storage that causes crosstalk effects to another line connected to the non-volatile storage, means for sending a command to the flash to replace the at least one line causing crosstalk effects, means for selecting at least one line to replace the at least one line causing crosstalk effects with a spare line and means for replacing the at least one line causing crosstalk effects with the spare line.

In another non-limiting embodiment, an arrangement is disclosed comprising an application specific integrated circuit; a flash interface module connected to the application specific integrated circuit, the flash interface module having a flash interface, a flash memory interface configured to accept and transmit data; a flash memory configured to receive and transmit data from the flash memory interface; at least two lines configured to transmit data from the flash interface module to the flash memory interface and at least one spare line configured to transmit data from the flash interface module to the flash memory interface, the at least one spare line configured to replace one of the at least two lines configured to transmit data from the flash interface to the flash memory interface.

In another non-limiting embodiment, a method for elimination of crosstalk effects in a non-volatile storage is disclosed comprising measuring amount of crosstalk at least one line connected to the non-volatile storage that causes crosstalk effects to another line connected to the non-volatile storage, comparing the at least one line connected to the non-volatile storage that causes crosstalk effects to a threshold value for crosstalk effects, sending a command to the non-volatile storage to replace the at least one line causing crosstalk effects when the comparing the at least one line connected to the non-volatile is above the threshold value for crosstalk effects, selecting the at least one line to replace the at least one line causing crosstalk effects with a spare line and replacing the at least one line causing crosstalk effects with the spare line.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
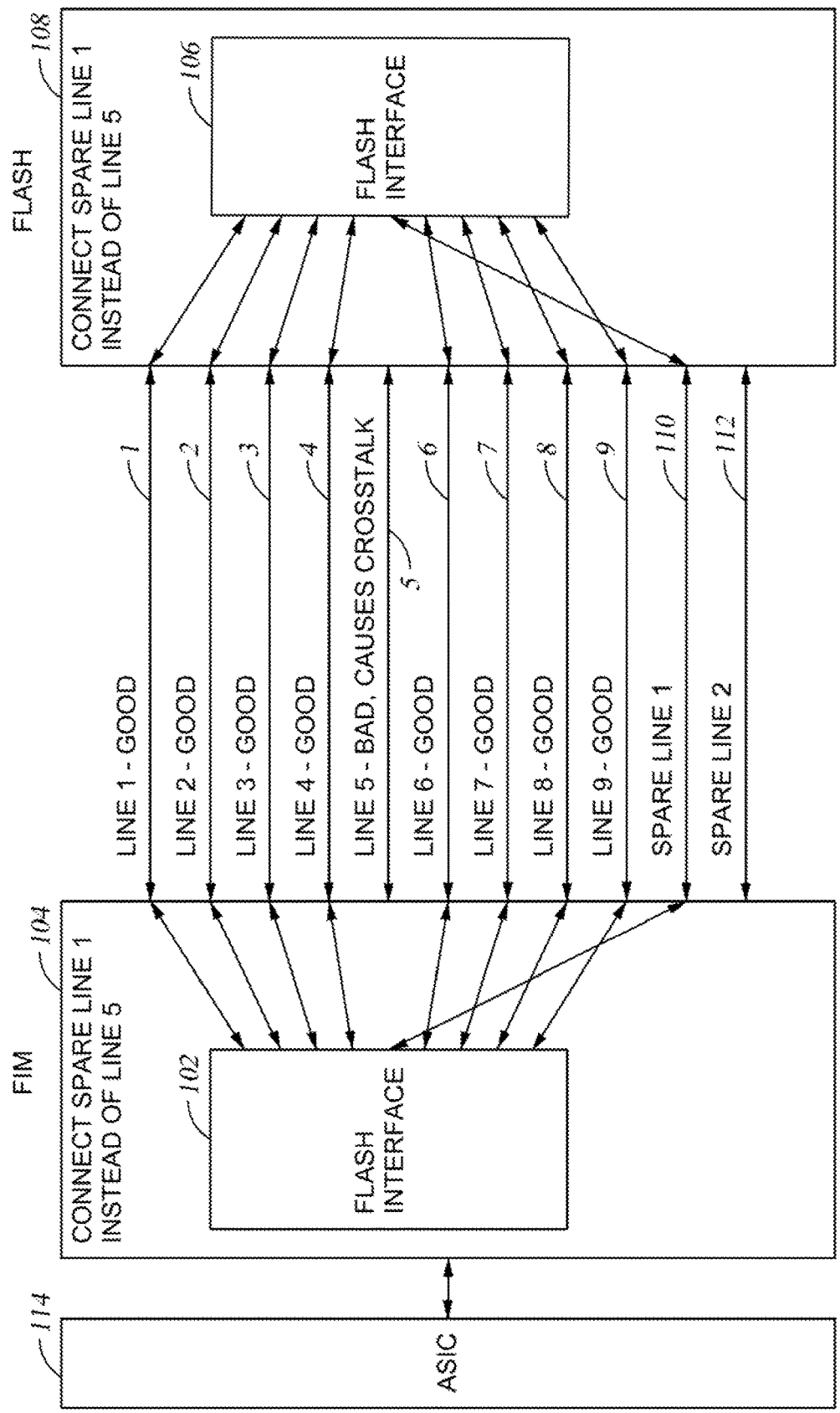
FIG. 1 is a diagram of a line replacement mechanism between a flash interface module and a flash memory.

Some embodiments will now be described with reference to the figures. Like elements in the various figures will be referenced with like numbers for consistency. In the following description, numerous details are set forth to provide an understanding of various embodiments and/or features. It will be understood, however, by those skilled in the art that some embodiments may be practiced without many of these details and that numerous variations or modifications from the described embodiments are possible. As used herein, the terms "above" and "below", "up" and "down", "upper" and "lower", "upwardly" and "downwardly", and other like terms indicating relative positions above or below a given point or element are used in this description to more clearly describe certain embodiments.

Aspects of the present disclosure relate to computer operations and computer storage. In the embodiments described, a data storage arrangement is connected to a host system. The function of the data storage arrangement is to accept data and store the data until needed again by a user or the host. The data storage arrangement may be configured to accept bursts of data, depending on the computer process performed, therefore the data storage arrangement is configured with multiple memory units that provide for various states of usage. Certain sections of the data storage arrangement are configured of memory systems that provide for fast action (low latency) so that computer processes may be conducted at a rapid pace. Such low latency performance may be accomplished by single layer cell memory configurations. If bulk amounts of data are required to be stored, multiple layer cell memory configurations may also be present, such as triple level cell memory configurations. The data storage arrangement may have an interface that allows the data storage arrangement to connect with the host. The interface may be a SAS Interface or Serial ATA (SATA) compatible interface, as a non-limiting embodiments. The memory storage may have a configuration to allow for plug and play ability. Although described as having a SATA compatible interface, the memory storage device may be provided with a configuration which allows for access by wireless technology. In one non-limiting embodiment, 802.11ac technology may be used to provide for fast performance for smooth streaming. Wireless technology may use, for example, between 2.5 GHz to 5 GHz frequencies for connection. In some embodiments, the storage may allow users to choose the frequencies for wireless connection.

Auxiliary connections may be provided to the data storage arrangement to allow for addition options for inputting data directly to the data storage arrangement without interfacing with a host. Such direct input of data may be provided through placement of an integrated secure digital card to offload or copy data. Other auxiliary connections may be provided for additional input/output operations. Such connections may be USB 2.0, USB 3.0, Firewire or other hard wired configurations. Gigabit Ethernet interfaces and connections may also be used.

The data storage arrangement may be configured with a separate power supply or may be run through other power supply means, such as from a computer mother board. In some embodiments, an internal battery may be provided to power the data storage arrangement as an independent entity. Such configurations may be provided such that the data storage arrangement is a portable unit. In such data storage arrangement configurations, the power supply means may be sufficient to power a host and/or charge a host, such as a mobile cellular phone, personal computer, tablet, camera or other configuration. The data storage arrangement may also have a battery indicator to allow a user to understand the amount of charge in the data storage arrangement from a visual inspection. Such battery indicators may be, for example, low energy consumption light emitting diode technology. In specific embodiments, the data storage arrangement may be provided with a circuit to allow for charging and prevent overcharging of the system if the data storage arrangement is connected to an outside power supply for an extended period. In some embodiments, circuitry may be used to determine if a threshold of inactivity has been reached for the storage system, thereby causing the system to enter a low power consumption mode, conserving battery power.

In one non-limiting embodiment, a controller is provided to control actions of the data storage arrangement as required by the host. The controller may also be configured to perform maintenance activities for the data storage arrangement to allow for efficient use.

Internal software may be provided on the data storage arrangement to allow for efficient storage and read capability of data on the system. Such internal software may be used such that the data storage arrangement can be used as a portable media server to wirelessly stream media to a host or output device. Such output devices may include, but not be limited to, smart televisions, smart phones, stereo audio system.

The internal software may also be provided such that the access of data may be performed by cloud applications designed for interface with the data storage arrangement.

The internal software of the data storage arrangement may also be configured to provide for security of the data storage arrangement. Safeguarding of material provided on the data storage arrangement prevents unauthorized access to sensitive information contained on the system. Such security may be in the form of password protection, such as a Wi-Fi password protection. In some embodiments, the data storage arrangement may be configured with software that allows the data storage arrangement to create a hardware lock. Such hardware locks may prevent access through a USB connection.

The internal software may also be capable of providing diagnostic support for users. In such configurations, two different modes may be provided. A quick test software program may be provided with the capability to check the data storage arrangement for major performance problems. A full test mode may also be provided to provide detailed status information to a user. Such status information may be, for example, total amount of memory of the data storage arrangement, the amount of memory storage used, storage divisions provided on the data storage arrangement, firmware versions for the internal software, memory block errors and similar data. The internal software may also have the capability of accepting data to update the firmware of the internal software.

The internal software may also be used as a server system wherein in certain embodiments, Digital Living Network Alliance (DLNA) enabled software is incorporated. Such software allows for quick file transfer and error checked operation as a server. In some embodiments, the internal software may be provided with the capability to use file transfer protocol (FTP) to enable the transfer of content to and from the memory storage in public access folders. The data storage arrangement may also provide for either a secured log in or an anonymous login capability.

In specific embodiments, the data storage arrangement may be configured such that the system interacts with cloud storage systems. In the event that the data storage arrangement approaches the limits of storage capability, the data storage arrangement may allow for some of the data to be stored on cloud based systems. Selection of the data to be stored on such external storage systems may be governed by the controller which is configured to determine what sections of data may be appropriately stored in cloud based systems to minimize latency for users. The storage system may have a unique identifier MAC address and device name to allow the system to operate on an independent basis. The storage system may also be operated in a configuration that allows for the system to clone a MAC address of a computer that is attached.

The overall capacity of the data storage arrangement may vary according to the different embodiments provided. Capacities 1 TB, 2 TB up to 64 TB may be provided, as non-limiting embodiments. Different form factors may also be provided. In the illustrated embodiment, a form factor of 2.5 inches is provided. Other form factors such as 1.8 inch or 3.5 inch may also be used. Compatibility of the data storage arrangement may be provided for Windows operating systems, Windows Server, Linux and Mac OS, as non-limiting embodiments. Example Windows operating systems that may use the system may be Windows 10, Windows 8 and Windows 7. Example Mac OS systems may be Lion (Mac OSA 10.7), Mountain Lion (Mac OS 10.8), Yosemite (Mac OS 10.10), El Captain (Mac OS 10.11), Sierra and Mavericks as non-limiting embodiments. Supported browsers for the storage system may be, in non-limiting embodiments, Internet Explorer, Safari, Firefox and Google Chrome.

Software may also be included in the system to allow for quick and automatic backups of data according to user prescribed requirements. Such backup ability may be compliant with Windows based backup and restore functions and/or Apple Time Machine requirements. Furthermore, software may be provided to add more than one user to the storage system. Users can be added or deleted according to an administration account. Such administration account may also allow for restricted access for certain users according to administration requirements.

Aspects presented herein describe techniques for automatically measuring latency in computer systems when performing such activities as writing data to or reading data from a connected data storage device. As provided above, a data storage device may be connected to a computer through a hard wire connection or through a wireless connection. A controller included with the data storage device may be configured to record timestamps or place timestamps associated with events while executing read commands. The controller may include circuitry that is configured to record a timestamp when the read command is received, when the read command is executed and/or when other events associated with the read command occur. The controller may be configured to determine total elapsed time between any timestamps and record information about the operating characteristics of the computing system if an elapsed time is greater than a threshold amount of time. The techniques of this disclosure allow for inserting data related to logical block address latency to allow the system to identify what portions of the overall system are causing the greatest latency.

Referring to FIG. 1, a line replacement mechanism diagram is illustrated. Nine individual lines extend from a flash interface 102 in a flash interface module 104 to a flash interface 106 in flash memory 108. The lines, 1, 2, 3, 4, 5, 6, 7, 8, 9 are also accompanied by two spare lines 110 and 112. In the illustrated embodiment, lines 1, 2, 3, 4 and 6, 7, 8, 9 are considered "good" and do not cause crosstalk issues. Line 5, however, is involved with crosstalk and is therefore considered bad.

In the illustrated embodiment, an application specific integrated circuit (ASIC 114) is connected to a flash interface module 104 that has a flash interface 102. A flash memory 108 is configured with a flash interface 106 to accept and transmit data to and from the flash memory 108. The lines 1, 2, 3, 4, 5, 6, 7, 8, 9 extending from the flash interface 102 to the flash interface 106 may be any diameter. As crosstalk may be dependent upon physical characteristics of the line diameter, the line diameters may vary. In some embodiments, the spare 110, 112 lines may be the same diameter. In other embodiments, the spare lines 110, 112 may be diameters different than one another. In that way, a spare line could be relegated to substitution for a specific subset of lines 1, 2, 3, 4, 5, 6, 7, 8, 9.

In a like manner, the diameter of the spare lines 110, 112 may vary according to the needs of the replacement. The spare lines 110, 112, may therefore not have the same diameter as lines 1, 2, 3, 4, 5, 6, 7, 8, 9.

Figure 2:
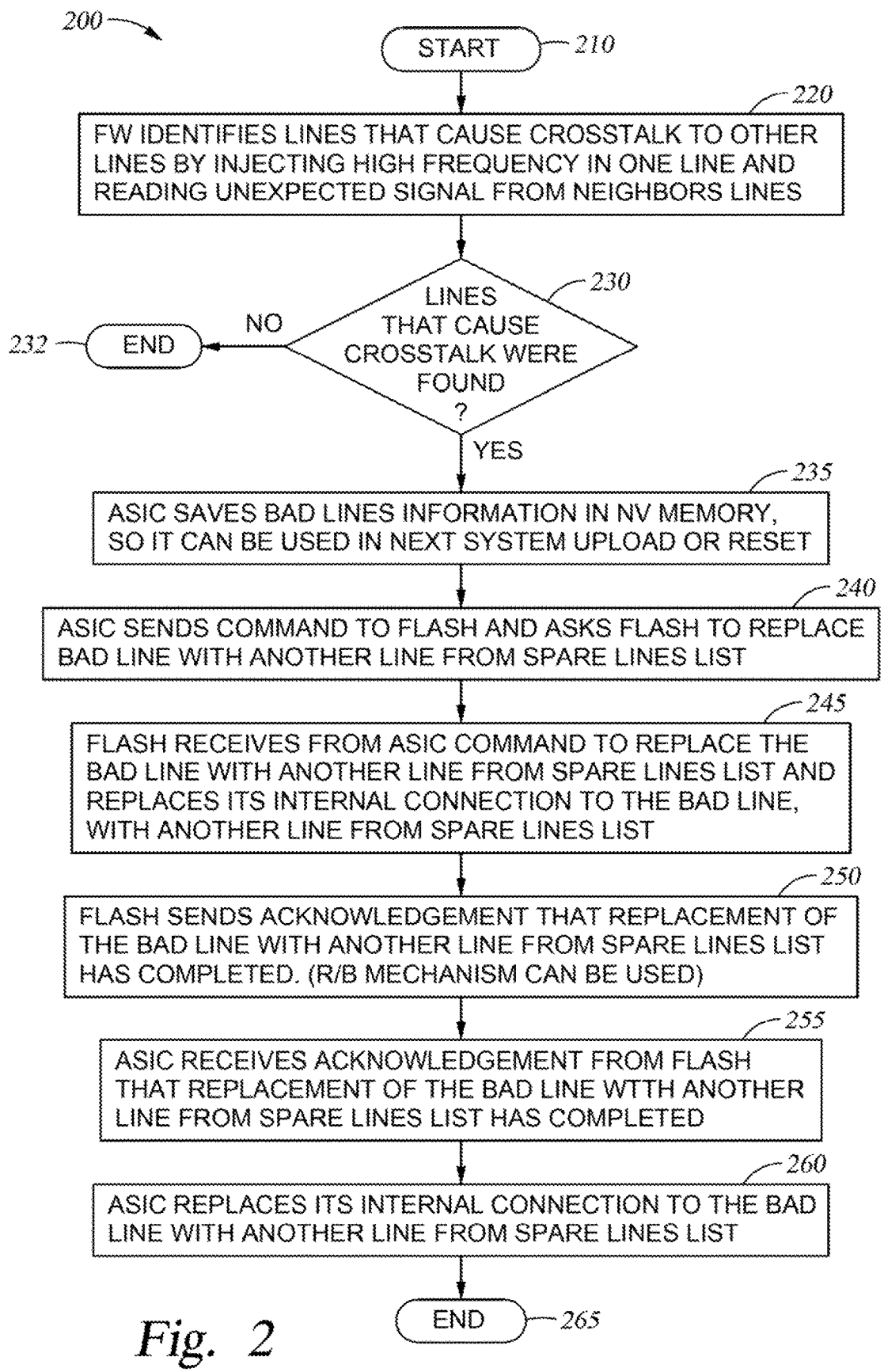
FIG. 2 is a flow chart for replacement of lines due to crosstalk problems encountered.

In order to eliminate crosstalk, it is desired to replace line 5 with one of the spare lines 110 or 112. A method is provided to identify bad lines and replace the bad lines with good lines. Referring to FIG. 2, a method 200 for replacing a bad line with a good line (one not involved with crosstalk) is illustrated. The method 200 starts at 210. At 220, firmware identifies lines that cause crosstalk to other lines by injecting high voltage in one line and reading unexpected signals from neighbor lines. At 230 a query is run to determine if lines that cause crosstalk were found. If no lines were found at 230, the method ends at 232. If lines that cause crosstalk were found, then, at 235, the ASIC 114 saves bad lines information in non-volatile memory so the data can be used in the next system upload or reset. At 240, the ASIC sends a command to flash and requests flash to replace any bad lines with another line from a spare lines list. At 245 the flash receives from the ASIC 114 a command to replace the bad line with another line from the spare lines list and replaces its internal connection to the bad line, with another line from the spare lines list. At 250, the flash sends acknowledgement that replacement of the bad line with another line from the spare lines list has completed. At 255, the ASIC 114 receives acknowledgement from the flash that replacement of the bad line with another line from the spare lines list has completed. At 260, the ASIC 114 replaces it internal connection to the bad list with another line from the spare lines list. The method ends at 265.

As illustrated, the method may substitute one line for another that extends from the flash interface 102 to the flash interface 106 at the flash memory 108. Although described as replacement of a single line, it will be apparent that more than one line may be substituted for "bad" lines. The description, therefore, of having two spare lines 110, 112 is merely illustrative. More than two spare lines 110, 112 may be provided.

As non-limiting embodiments, four spare lines may be provided.

In other embodiments, there are possibilities where there are more than one line that is experiencing crosstalk. Although described as replacing a single line, other embodiments may be provided wherein multitudes of lines may be replaced.

In still further embodiments, analysis of crosstalk may occur in all of the lines, 1, 2, 3, 4, 5, 6, 7, 8, 9 and an evaluation may be conducted on each of the lines. There is a possibility that the number of lines that undergo evaluation may indicate that there are more lines that are subject to crosstalk than spare lines extending between flash interface 102, 106. In this type of embodiment, an evaluation may be conducted on the lines to determine which of the lines is subject to more crosstalk. The lines that are subject to the most crosstalk may then be replaced with the number of spare lines that are present.

In still further embodiments, a quality check may be provided for lines that have been replaced with spare lines. In these embodiments, a comparison may be run with the "bad" line compared to the replaced spare line for effects of crosstalk. If the replaced "bad" line has superior characteristics to that of the replaced spare line, then the "bad" line may be reactivated and the spare line decommissioned, as the "bad" line has superior characteristics to that of the spare line.

Comparisons of the crosstalk effects may be performed by an application specific integrated circuit (ASIC) that is configured to evaluate the crosstalk, as needed. The ASIC may have a programmable processor to allow a user to input values that would be considered acceptable. Such input values may be, for example, threshold values that would allow for some crosstalk effects to occur, but at a level that is sufficient to be corrected by other error correction techniques.

In one example embodiment, a sync program and listening operation may occur on a same data path. In this example embodiment, dies in the same data path unit may work in parallel and while performing those operations, measure crosstalk at a destination die.

In another example embodiment, a sync program and listening operations may be located in different data paths, on separate dies. In this embodiment, dies may work in parallel and while performing those operations, measure crosstalk at a destination die.

In a still further embodiment, a user may activate a command telling firmware to enter a crosstalk measuring mode. The user may activate file write operations on other storage devices that are physically close to the subject device. The storage device may then measure noise and crosstalk effects and, if present, then replace lines that are affected by crosstalk.

In one non-limiting embodiment, a method for elimination of crosstalk effects in a non-volatile storage is disclosed comprising identifying at least one line connected to the non-volatile storage that causes crosstalk effects to another line connected to the non-volatile storage, sending a command to the flash to replace the at least one line causing crosstalk effects, selecting at least one line to replace the at least one line causing crosstalk effects with a spare line and replacing the at least one line causing crosstalk effects with the spare line.

In one non-limiting embodiment, the method may be accomplished wherein the identifying the at least one line connected to the non-volatile storage that causes the crosstalk effects to the another line connected to the non-volatile storage is performed by injecting a voltage in the at least one line connected to the non-volatile storage; and reading signals by the another line to determine if crosstalk effects occur.

In another non-limiting embodiment, the method may be accomplished wherein the selecting the at least one line is from a spare lines list.

In one non-limiting embodiment, the method may further comprise replacing internal connections of the at least one line causing crosstalk effects with the new internal connections to the another line.

In another non-limiting embodiment, the method may further comprise sending an acknowledgement to a user than internal connections have been replaced.

In another non-limiting embodiment, the method may further comprise saving data in the non-volatile storage related to the at least one line causing crosstalk effects.

In another non-limiting embodiment, the method may be accomplished wherein the replacing internal connections of the at least one line causing crosstalk effects with the new internal connections to the another line entails at least one of replacing a connection at a flash interface at a flash interface module and replacing a connection at a flash interface at a flash module.

In another non-limiting embodiment, the method may be accomplished wherein the sending the command to the flash to replace the at least one line causing crosstalk effects is from an application specific integrated circuit.

In another embodiment, an arrangement is disclosed comprising means for identifying at least one line connected to the non-volatile storage that causes crosstalk effects to another line connected to the non-volatile storage, means for sending a command to the flash to replace the at least one line causing crosstalk effects, means for selecting at least one line to replace the at least one line causing crosstalk effects with a spare line and means for replacing the at least one line causing crosstalk effects with the spare line.

In another embodiment, the arrangement may further comprise means for replacing internal connections of the at least one line causing crosstalk effects with the new internal connections to the another line.

In another embodiment, the arrangement may further comprise means for sending an acknowledgement to a user than internal connections have been replaced.

In another embodiment, the arrangement may further comprise means for saving data in the non-volatile storage related to the at least one line causing crosstalk effects.

In another embodiment, an arrangement is disclosed comprising: an application specific integrated circuit, a flash interface module connected to the application specific integrated circuit, the flash interface module having a flash interface, a flash memory interface configured to accept and transmit data, a flash memory configured to receive and transmit data from the flash memory interface, at least two lines configured to transmit data from the flash interface module to the flash memory interface and at least one spare line configured to transmit data from the flash interface module to the flash memory interface, the at least one spare line configured to replace one of the at least two lines configured to transmit data from the flash interface to the flash memory interface.

In another embodiment, the arrangement may be accomplished wherein the at least one spare line is at least two spare lines.

In another non-limiting embodiment, the arrangement may be configured wherein the at least two lines is 9 lines.

In another non-limiting embodiment, the arrangement may further comprise an arrangement to send and receive data across the at least two lines and to determine cross talk among the at least two lines.

In another non-limiting embodiment, the arrangement may be configured wherein the arrangement to send and receive data is configured to increase a voltage in at least one of the at least two lines.

In another non-limiting embodiment, the arrangement may be configured wherein the arrangement is further configured to provide the voltage a user defined frequency.

In another non-limiting embodiment, a method for elimination of crosstalk effects in a non-volatile storage is disclosed comprising measuring at least one line connected to the non-volatile storage that causes crosstalk effects to another line connected to the non-volatile storage, comparing the at least one line connected to the non-volatile storage that causes crosstalk effects to a threshold value for crosstalk effects, sending a command to the non-volatile storage to replace the at least one line causing crosstalk effects when the comparing the at least one line connected to the non-volatile is above the threshold value for crosstalk effects, selecting the at least one line to replace the at least one line causing crosstalk effects with a spare line and replacing the at least one line causing crosstalk effects with the spare line.

In another non-limiting embodiment, the method may be accomplished wherein the measuring is performed by an application specific integrated circuit.

What is claimed is:

1. An arrangement, comprising:
    a flash interface module connected to the application specific integrated circuit, the flash interface module having a flash interface;
    a flash memory interface configured to accept and transmit data;
    a flash memory configured to receive and transmit data from the flash memory interface;
    at least two lines configured to transmit data from the flash interface module to the flash memory interface; and
    at least one spare line configured to transmit data from the flash interface module to the flash memory interface, the at least one spare line; and
    an application specific integrated circuit configured to replace one of the at least two lines configured to transmit data from the flash interface to the flash memory interface.

2. The arrangement according to claim 1, wherein the at least one spare line is at least two spare lines.

3. The arrangement according to claim 1, wherein the at least two lines is 9 lines.

4. The arrangement according to claim 1, further comprising:
    an arrangement to send and receive data across the at least two lines and to determine cross talk among the at least two lines.

5. The arrangement according to claim 4, wherein the arrangement to send and receive data is configured to increase a voltage in at least one of the at least two lines.

6. The arrangement according to claim 5, wherein the arrangement is further configured to provide the voltage a user defined frequency.

7. The arrangement according to claim 1, wherein the application specific integrated circuit is configured to store a specific line number that has been determined to have crosstalk.

8. The arrangement according to claim 7, wherein the application specific circuit is further configured to provide the specific line number information to a host system on a host system reset.

* * * * *